(12) United States Patent
Lee et al.

(10) Patent No.: US 10,021,799 B2
(45) Date of Patent: *Jul. 10, 2018

(54) ELECTRONIC CONTROL APPARATUS FOR VEHICLE USING POTTING LAYER AND METHOD OF MANUFACTURING THE SAME

(71) Applicant: HYUNDAI AUTRON CO., LTD., Seongnam-si (KR)

(72) Inventors: Wan Kyu Lee, Yongin-si (KR); Man Ho Seok, Seongnam-si (KR)

(73) Assignee: Hyundai Autron Co., Ltd., Seongnam-si (KR)

( * ) Notice: Subject to any disclaimer, the term of this patent is extended or adjusted under 35 U.S.C. 154(b) by 129 days.

This patent is subject to a terminal disclaimer.

(21) Appl. No.: 14/937,033

(22) Filed: Nov. 10, 2015

(65) Prior Publication Data

US 2016/0135317 A1 May 12, 2016

(30) Foreign Application Priority Data

Nov. 12, 2014 (KR) .................. 10-2014-0157116

(51) Int. Cl.
*H05K 5/00* (2006.01)
*H05K 5/06* (2006.01)
(Continued)

(52) U.S. Cl.
CPC ......... *H05K 5/064* (2013.01); *H01R 13/5202* (2013.01); *H01R 13/5213* (2013.01);
(Continued)

(58) Field of Classification Search
USPC .................. 361/752, 679.01, 748
See application file for complete search history.

(56) References Cited

U.S. PATENT DOCUMENTS

| 6,835,090 B1* | 12/2004 | Liedtke ............. H01R 13/5216 439/276 |
| 9,185,831 B2* | 11/2015 | Moon .................. H05K 5/0034 |
| 2014/0322979 A1* | 10/2014 | Ikeda ..................... H01R 24/38 439/620.29 |

FOREIGN PATENT DOCUMENTS

| CN | 102833983 A | 12/2012 |
| KR | 10-1418683 B1 | 7/2014 |

OTHER PUBLICATIONS

Korean Intellectual Property Office, Office Action for Korean patent application No. 10-2014-0157116, Oct. 1, 2015, Korea.

* cited by examiner

*Primary Examiner* — Andargie M Aychillhum
(74) *Attorney, Agent, or Firm* — Baker McKenzie; Hyunho Park

(57) ABSTRACT

An electronic control apparatus for a vehicle according to the present invention includes: an electronic control board which electrically controls respective parts in the vehicle; a connector which is electrically connected with the electronic control board; an extruded housing which is opened at both sides, and has one side into which the connector connected with the electronic control board is inserted and accommodated in a slot manner; a connector cover which is coupled to the connector and covers the one open side of the extruded housing into which the connector is inserted; and a back cover which covers the other open side of the extruded housing, in which a first potting layer is formed at an upper side of the connector cover, and a second potting layer is formed in the back cover adjacent to the other side of the extruded housing.

7 Claims, 5 Drawing Sheets

(51) Int. Cl.
*H01R 13/52* (2006.01)
*H01R 43/00* (2006.01)
*H01R 12/72* (2011.01)

(52) U.S. Cl.
CPC ......... *H01R 43/005* (2013.01); *H05K 5/0039* (2013.01); *H01R 12/724* (2013.01); *H01R 2201/26* (2013.01)

ELECTRONIC CONTROL APPARATUS FOR VEHICLE USING POTTING LAYER AND METHOD OF MANUFACTURING THE SAME

CROSS-REFERENCE TO RELATED APPLICATIONS

This application claims priority to and the benefit of Korean Patent Application No. 10-2014-0157116 filed in the Korean Intellectual Property Office on Nov. 12, 2014, the entire contents of which are incorporated herein by reference.

TECHNICAL FIELD

The present specification relates to an electronic control apparatus for a vehicle, and more particularly, to an electronic control apparatus which has a tight sealing structure between an extruded housing, a connector cover, and a back cover of the electronic control apparatus such as an engine electronic control unit (ECU) for a vehicle.

BACKGROUND ART

In general, an electronic control apparatus (electronic control unit (ECU)), which electronically controls various types of devices, is mounted in a vehicle. The electronic control apparatus receives information from sensors or switches that are installed at respective locations of the vehicle. The electronic control apparatus serves to process the received information, and perform various types of electronic control in order to improve ride quality and safety of the vehicle, or provide various types of convenience to a driver and an occupant.

Specifically, the electronic control apparatus controls states of an engine, an automatic transmission, and an anti-lock brake system (ABS) of the vehicle by using a computer. In addition, with the development of performance of the vehicle and the computer, the electronic control apparatus serves to control all parts in the vehicle such as a driving system, a braking system, and a steering system in addition to the automatic transmission.

The electronic control apparatus has a structure that includes a case which includes a cover at an upper side and a base at a lower side, a printed circuit board (PCB) which is accommodated in the case, and a connector which is connected to a front end of the PCB so as to be connected with an external socket. Further, the cover and the base are constructed to be assembled together while covering the PCB. In particular, the connector, which is interposed between the cover and the base when the cover and the base are assembled, forms a sealing structure with the cover side and the base side.

The electronic control apparatus has a high-degree integrated control circuit means. Therefore, the electronic control apparatus requires a predetermined sealing structure that may prevent moisture or foreign substances from flowing into the electronic control apparatus from the outside. In general, in the case of the electronic control apparatus, the cover and the base are assembled together with the connector in a state in which a sealing agent is inserted into coupling portions between the cover, the base, and the connector. As a result, the PCB and the like in the electronic control apparatus are protected.

However, the sealing structures, which are applied to the electronic control apparatus in the related art, mostly have a structure in which a sealing member is applied onto coupling portions between a connector side groove or protrusion and cover side and base side protrusions or grooves, and as a result, a sufficient sealing area cannot be made. Therefore, it is difficult to ensure sealing quality with respect to assembled portions between the connector, the cover, and the base.

As one example of the sealing structure, a slot-type electronic control apparatus has a sealing structure in which an O-ring is inserted between a housing body and a cover.

The electronic control apparatus in the related art, which is provided with a slot-type housing, includes a housing body, a cover, a connector, and a PCB.

The housing body is a slot-type body among the existing various types of housings.

The connector is provided with an inner pin and an outer pin, and coupled to the cover.

The cover is coupled to the PCB, and a slot formed as the PCB is coupled to the housing body. Here, the O-ring is inserted before the housing body and the cover are coupled.

That is, in the case of a waterproof slot-type housing in the related art, the O-ring is inserted between the housing body and the cover. The housing body and the cover are tightly attached so that a coupling portion between the housing body and the cover is sealed. Therefore, the O-ring, which is suitable for the cover, needs to be manufactured in advance before the housing body and the cover are coupled, and the manufactured O-ring needs to be mounted inside the cover.

Meanwhile, the slot-type electronic control apparatus may be manufactured by using an extruded housing. Front and rear sides of the extruded housing have the same cross section. In addition, the extruded housing is constructed to be opened at the front and rear sides.

Because of the nature of the extruded housing, the waterproof electronic control apparatus, which uses the extruded housing, inevitably has a complicated structure. In addition, complicated components need to be added in order to enhance a waterproof property of the extruded housing. The reason is that the complicated structure and components prevent moisture or foreign substances from flowing into the extruded housing from the outside.

Therefore, in the case of the waterproof electronic control apparatus that uses the extruded housing, it is necessary to conduct, in advance, researches and developments on a waterproof structure capable of simplifying process methods and reducing component costs.

SUMMARY OF THE INVENTION

The exemplary embodiments of the present specification have been made in an effort to provide an electronic control apparatus having an extruded housing, in which a connector cover and a back cover are coupled to a front side and a rear side of the extruded housing, respectively, and separate potting layers are provided to prevent moisture or foreign substances from flowing into the extruded housing from the outside.

The exemplary embodiments of the present specification have also been made in an effort to provide an electronic control apparatus, in which sealing spaces between a connector cover and an extruded housing and between a back cover and the extruded housing are sealed without using a special waterproof connector or an O-ring to implement waterproofing feature, thereby improving a waterproofing performance of the extruded housing and simplifying a manufacturing process.

An exemplary embodiment of the present invention provides an electronic control apparatus for a vehicle, including: an electronic control board which electrically controls respective parts in the vehicle; a connector which is electrically connected with the electronic control board; an extruded housing which is opened at both sides, and has one side into which the connector connected with the electronic control board is inserted and accommodated in a slot manner; a connector cover which is coupled to the connector and covers the one open side of the extruded housing into which the connector is inserted; and a back cover which covers the other open side of the extruded housing, in which a first potting layer is formed at an upper side of the connector cover, and a second potting layer is formed in the back cover adjacent to the other side of the extruded housing.

The first potting layer and the second potting layer may be formed by applying a potting liquid with predetermined viscosity or higher onto the connector cover and the back cover, respectively, in order to prevent foreign substances from flowing into the extruded housing.

The connector cover may further include at least one screw groove which is formed at an edge of a lateral side thereof so as to fix the connector cover to the extruded housing by means of a screw.

The connector cover may further include a cover extended portion which is extended by a predetermined length along a lateral side adjacent to the extruded housing and the connector.

The connector cover may be provided with a stepped portion, which is formed at an upper side of the connector cover and has a height greater than a height of the first potting layer, in order to reduce the amount of potting liquid applied to form the first potting layer, and the first potting layer may be formed at a remaining portion except for the stepped portion.

The back cover may further include at least one protruding portion which separates the back cover from the extruded housing when the potting liquid is applied to form the second potting layer in the back cover adjacent to the other side of the extruded housing.

The back cover may further include a convex portion which allows the potting liquid to flow toward a waterproofing portion at the edge thereof when the potting liquid is applied to form the second potting layer in the back cover adjacent to the other side of the extruded housing.

Another exemplary embodiment of the present invention provides a method of manufacturing an electronic control apparatus for a vehicle, the method including: connecting a back cover to the other open side of an extruded housing which is opened at both sides; forming a second potting layer by applying a potting liquid in the back cover adjacent to the other side of the extruded housing; electrically connecting a connector with an electronic control board which electrically controls respective parts in the vehicle; coupling a connector cover to the connector; inserting the connector connected with the electronic control board into one side of the extruded housing in a slot manner, and accommodating the connector and the electronic control board in the housing by allowing the connector cover to cover the one side of the extruded housing; and forming a first potting layer at an upper side of the connector cover.

The method may further include fixing the connector cover to the extruded housing by coupling a screw to at least one screw groove formed at an edge of a lateral side of the connector cover.

The accommodating of the connector and the electronic control board may include coupling the connector cover, which has a cover extended portion extended by a predetermined length along a lateral side adjacent to the extruded housing and the connector, to the extruded housing and the connector.

The forming of the first potting layer may include forming the first potting layer by applying a potting liquid at a remaining portion at an upper side of the connector cover, except for a stepped portion which has a height greater than a height of the first potting layer, in order to reduce the amount of potting liquid applied to form the first potting layer.

The forming of the second potting layer may include forming the second potting layer by applying a potting liquid in the back cover having at least one protruding portion that separates the back cover from the other side of the extruded housing.

The forming of the second potting layer may include forming the second potting layer by applying a potting liquid in the back cover having a convex portion that allows the potting liquid to flow toward a waterproofing portion at an edge in the back cover.

The exemplary embodiments of the present specification may provide the electronic control apparatus having the separate potting layers, which may prevent moisture or foreign substances from flowing into the extruded housing from the outside.

According to the electronic control apparatus having the extruded housing according to the exemplary embodiments of the present specification, the connector cover and the back cover are coupled to the front side and the rear side of the extruded housing, respectively, thereby preventing moisture or foreign substances from flowing into the extruded housing from the outside.

According to the exemplary embodiments of the present specification, sealing spaces between the connector cover and the extruded housing and between the back cover and the extruded housing are sealed without using a special waterproof connector or an O-ring to implement a waterproofing feature, thereby improving a waterproofing performance of the extruded housing and simplifying a manufacturing process.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
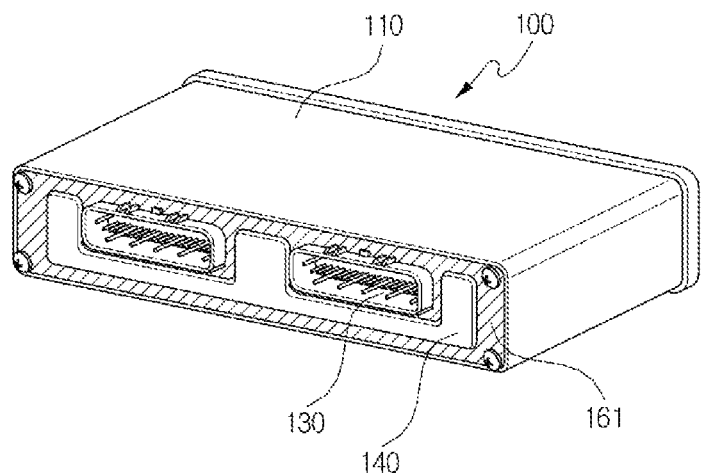
FIGS. 1 and 2 are front and rear perspective views of an electronic control apparatus for a vehicle using a potting layer according to an exemplary embodiment of the present specification.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, an exemplary embodiment of the present specification will be described in detail with reference to the accompanying drawings.

In the description of the exemplary embodiment, a description of technical contents, which are well known in the technical field to which the present specification pertains and are not directly relevant to the present specification, will be omitted. The reason is to more clearly provide the subject matter of the present specification without obscuring the subject matter, by omitting the unnecessary descriptions.

Similar to the reason described above, some constituent elements are exaggerated, omitted, or schematically illustrated in the accompanying drawings. In addition, a size of each of the constituent elements does not completely reflect a real size. The same or corresponding constituent elements will be designated by the same reference numerals in the respective drawings.

Figure 2:
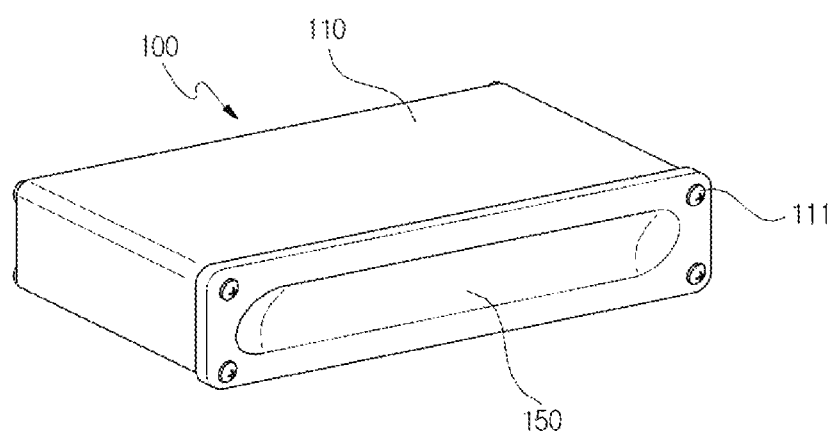

FIGS. 1 and 2 are front and rear perspective views of an electronic control apparatus for a vehicle using a potting layer according to an exemplary embodiment of the present specification.

In an electronic control apparatus 100, connectors 130 are inserted into a front surface of an extruded housing 110. Here, the electronic control apparatus 100 refers to a component in which an integrated control circuit means such as an electronic control board, for example, a printed circuit board (PCB), which electrically controls respective parts in the vehicle, is mounted. Therefore, the electronic control apparatus 100 has a tight sealing structure for preventing moisture or foreign substances from flowing into the electronic control apparatus 100 from the outside.

Hereinafter, the front surface of the extruded housing 110 is defined as a surface to which the connector 130 is coupled, and a rear surface of the extruded housing 110 is defined as a surface to which a back cover 150 is coupled.

As illustrated in FIG. 1, the connector 130 and a connector cover 140 are coupled to the extruded housing 110 at a front side of the electronic control apparatus 100. Here, a first potting layer 161 is formed on the connector cover 140, such that connecting portions between the extruded housing 110, the connector 130, and the connector cover 140 are sealed.

As illustrated in FIG. 2, the back cover 150 is coupled to the extruded housing 110 at a rear side of the electronic control apparatus 100. Here, a second potting layer 162 is formed in the extruded housing 110 to which the back cover 150 is coupled, such that a connecting portion between the extruded housing 110 and the back cover 150 is sealed.

Figure 3:
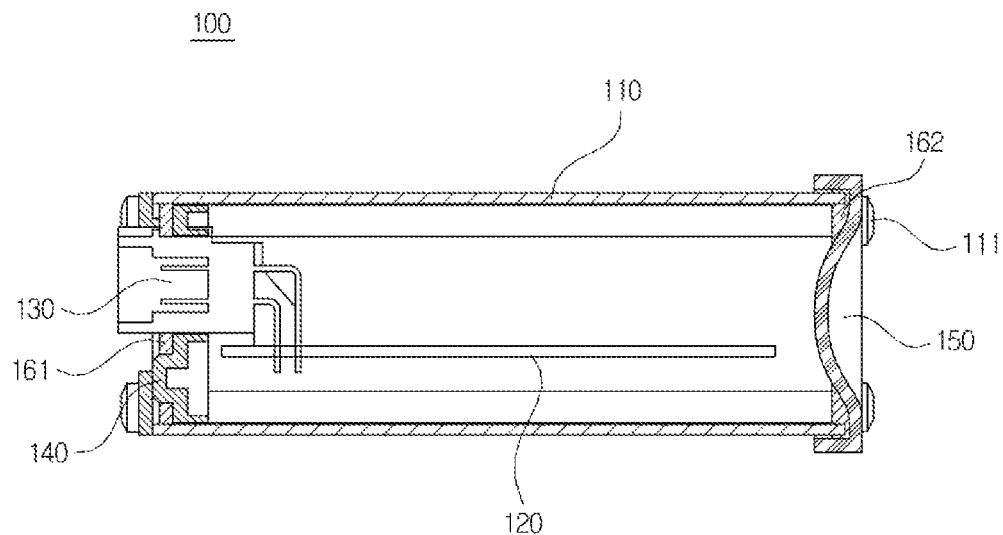
FIG. 3 is a cross-sectional view of the electronic control apparatus for a vehicle using the potting layer according to the exemplary embodiment of the present specification.

FIG. 3 is a cross-sectional view of the electronic control apparatus for a vehicle using the potting layer according to the exemplary embodiment of the present specification.

As illustrated in FIG. 3, the electronic control apparatus 100 includes the extruded housing 110, an electronic control board 120, the connector 130, the connector cover 140, and the back cover 150.

Hereinafter, the respective constituent elements of the electronic control apparatus for a vehicle using the potting layer according to the exemplary embodiment of the present specification will be described.

The connector 130 is coupled and electrically connected to the electronic control board 120. The connector 130 is provided with connector pins, and electrically connected with the electronic control board 120 through the connector pins. The connector pins may include a plurality of inner pins to be connected with the electronic control board 120 in the extruded housing 110, and a plurality of outer pins to be connected with an external part. The connector 130 may be coupled to the electronic control board 120 by being physically fitted with the electronic control board 120, and may be electrically connected with the electronic control board 120 through the inner pins. A tip portion of the connector 130, which is exposed to the outside, may be integrally connected to a rear end portion of the connector 130.

Electric elements, heat generating elements, or heat radiating plates may be provided at a top side or a bottom side of the electronic control board 120. The connector 130 is connected with the connector cover 140 at the outside thereof, and connected with the electronic control board 120 in the extruded housing 110.

The extruded housing 110 is opened at both sides, and the connector 130 to which the electronic control board 120 is connected, is inserted into and accommodated in one side of the extruded housing 110 in a slot manner. Therefore, when the connector 130 and the electronic control board 120 are inserted into and accommodated in the extruded housing 110 in a slot manner, the connector cover 140 is coupled to the one open side of the extruded housing 110. In addition, the back cover 150 is coupled to the other open side of the extruded housing 110. Here, the back cover 150 may be coupled to the rear side of the extruded housing 110 by means of screws fitted into screw grooves. Therefore, the electronic control board 120 and the connector 130 may be accommodated in the extruded housing 110.

The electronic control apparatus 100 includes the first and second potting layers 161 and 162 that are formed, respectively, in a state in which the connector cover 140 and the back cover 150 are coupled to the extruded housing 110. The first potting layer 161 is formed at an upper side of the connector cover 140, and the second potting layer 162 is formed in the back cover 150 adjacent to the other side of the extruded housing 110. In the electronic control apparatus 100 according to the exemplary embodiment of the present specification, the extruded housing 110 is sealed by using the first and second potting layers 161 and 162, thereby implementing a waterproof housing of a sealing structure. In addition, in the electronic control apparatus 100 according to the exemplary embodiment of the present specification, the first and second potting layers 161 and 162 are easily formed on the connector cover 140 and the back cover 150, respectively, thereby simplifying a process and reducing costs for the electronic control apparatus 100.

Here, the first and second potting layers 161 and 162 may be formed as a potting layer or a potting film by applying a potting liquid or a potting material, and then hardening the potting liquid or the potting material. To prevent foreign substances from flowing into the extruded housing 110, a potting liquid with predetermined viscosity or higher may be applied and formed onto the connector cover 140 and the back cover 150. For example, the first and second potting layers 161 and 162 may be formed by using silicone, epoxy, or urethane. In addition, the first and second potting layers 161 and 162 may be made of a potting material that is naturally hardened even though heat is not applied to the potting material. In some instances, the potting liquid or the potting material may be hardened to be the potting layer by heating the potting liquid or the potting material using an oven.

In the electronic control apparatus 100, the connector 130 and the connector cover 140 are coupled to the extruded housing 110. In addition, the first potting layer 161 is formed at the coupled portion. Therefore, the electronic control apparatus 100 has the general extruded housing 110 that may be implemented without mounting in advance an O-ring onto the connector cover 140 or using a special waterproof connector in which the connector 130 and the connector cover 140 are integrally configured, unlike the related art.

Figure 4:
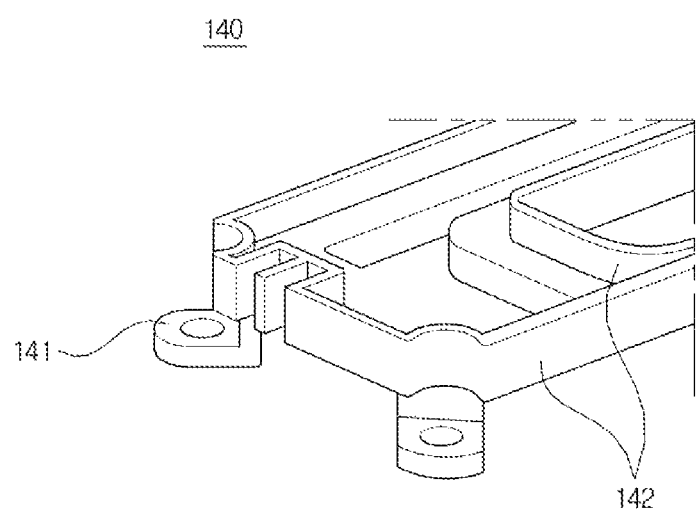
FIGS. 4 and 5 are structural views illustrating a shape of a connector cover according to the exemplary embodiment of the present specification.
Figure 5:
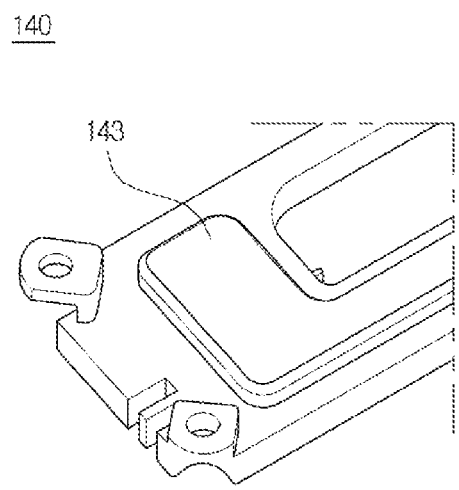

FIGS. 4 and 5 are structural views illustrating a shape of the connector cover according to the exemplary embodiment of the present specification.

FIG. 4 illustrates a shape of an upper side of the connector cover 140, and FIG. 5 illustrates a shape of a bottom side of the connector cover 140. The connector cover 140 is shaped to be potted without separately processing the extruded housing 110.

The connector cover 140 is coupled to the connector 130, and covers the one open side of the extruded housing 110 into which the connector 130 is inserted.

The first potting layer is formed at the upper side of the connector cover 140.

As illustrated in FIG. 4, the connector cover 140 may further include at least one screw groove 141 formed at an edge of a lateral side thereof. The connector cover 140 may be fixed to the extruded housing 110 by means of a screw 111 fitted into the screw groove 141. In addition, the connector cover 140 may further include a cover extended portion 142 which is extended by a predetermined length along a lateral side adjacent to the extruded housing 110 and the connector 130. The cover extended portion 142 serves to improve a waterproofing performance.

As illustrated in FIG. 5, the connector cover 140 may be provided with a stepped portion 143, which is formed at the upper side of the connector cover 140 and has a height greater than a height of the first potting layer 161, in order to reduce the amount of potting liquid applied to form the first potting layer 161. The first potting layer 161 may be formed only at a remaining portion at the upper side of the connector cover 140 having the stepped portion 143 except for the stepped portion 143.

Here, the first potting layer 161 is formed at the upper side, that is, at the upper side of the connector cover 140 where the connector 130 to which the electronic control board 120 is connected is inserted into and accommodated in the extruded housing 110 in a slot manner.

Figure 6:
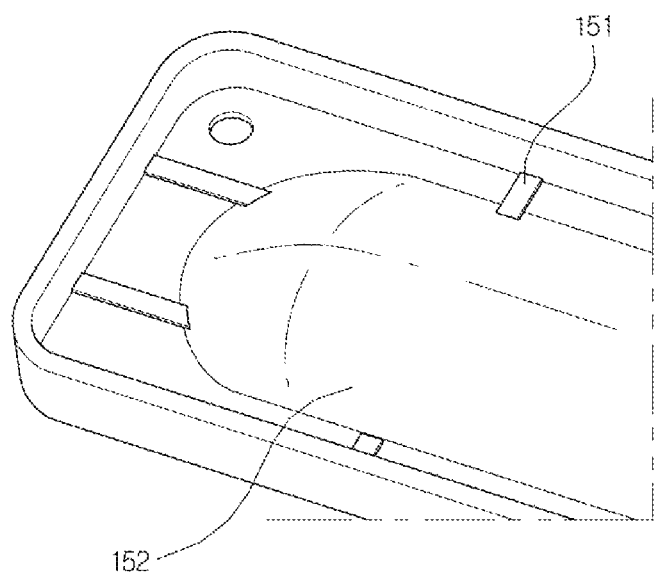
FIG. 6 is a structural view illustrating a shape of a back cover according to the exemplary embodiment of the present specification.

FIG. 6 is a structural view illustrating a shape of the back cover according to the exemplary embodiment of the present specification.

As illustrated in FIG. 6, the back cover 150 is shaped to easily implement potting and waterproofing features.

The back cover 150 may further include at least one protruding portion 151 which separates the back cover 150 from the extruded housing 110 when the potting liquid is applied to form the second potting layer 162 in the back cover 150 adjacent to the other side of the extruded housing 110. The at least one protruding portion 151 may lift up the extruded housing 110 and the back cover 150 when the potting liquid is applied.

The back cover 150 may further include a convex portion 152 which allows the potting liquid to flow toward a waterproofing portion at the edge thereof when the potting liquid is applied to form the second potting layer 162 in the back cover 150 adjacent to the other side of the extruded housing 110. The convex portion 152 has a rounded shape that allows the potting liquid to flow toward the waterproofing portion when the potting liquid is applied. That is, with the convex portion 152, the second potting layer 162 may be formed at the edge of the back cover 150.

As described above, the connector cover 140 and the back cover 150 have the shapes capable of minimizing the amount of potting liquid when the potting layers are formed.

Figure 7:
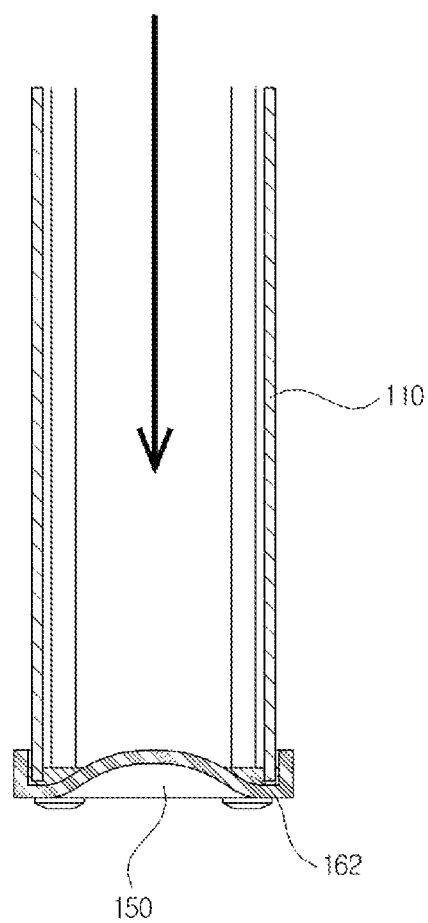
FIGS. 7 and 8 are views for explaining a process of manufacturing the electronic control apparatus for a vehicle using the potting layer according to the exemplary embodiment of the present specification.
Figure 8:
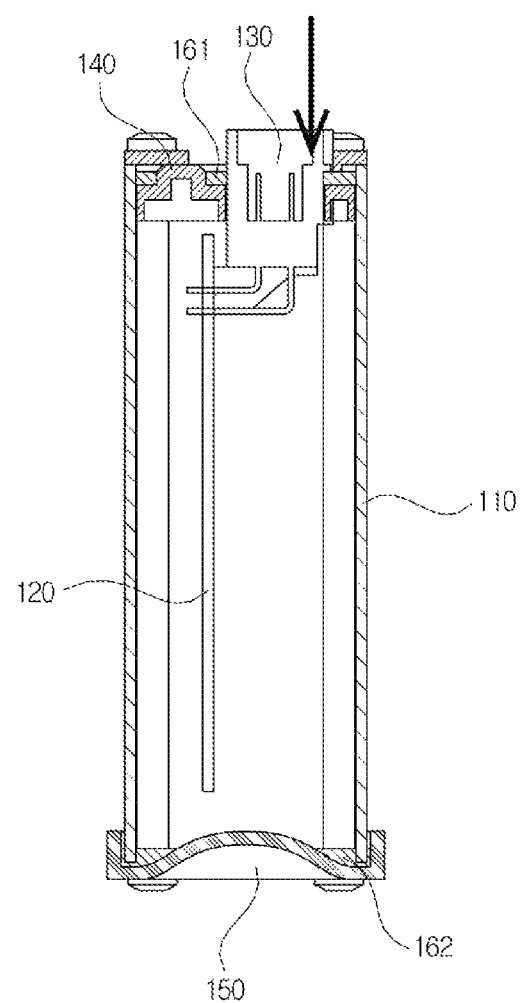

FIGS. 7 and 8 are views for explaining a process of manufacturing the electronic control apparatus for a vehicle using the potting layer according to the exemplary embodiment of the present specification.

Hereinafter, a process of manufacturing the electronic control apparatus 100 will be described.

First, the electronic control board 120, which electrically controls the respective parts in the vehicle, is manufactured by mounting various types of electronic elements onto the electronic control board 120.

The back cover 150 is connected to the other open side of the extruded housing 110 which is opened at both sides.

As illustrated in FIG. 7, the second potting layer 162 is formed in the back cover 150 adjacent to the other side of the extruded housing 110, by applying the potting liquid in a direction indicated by the arrow.

Thereafter, the connector 130 is coupled and electrically connected to the electronic control board 120. The connector 130 is provided with the connector pins, and electrically connected with the electronic control board 120 through the connector pins. The connector pins may include a plurality of inner pins to be connected with the electronic control board 120 in the extruded housing 110, and a plurality of outer pins to be connected with an external part.

The connector cover 140 is coupled to the connector 130.

The connector 130, which is coupled to the electronic control board 120, is inserted into one side of the extruded housing 110 in a slot manner, and the connector cover 140 covers one side of the extruded housing 110, such that the connector 130 and the electronic control board 120 are accommodated in the extruded housing 110.

As illustrated in FIG. 8, the first potting layer 161 is formed by applying the potting liquid at the upper side of the connector cover 140 in a direction indicated by the arrow. The process of forming the first and second potting layers 161 and 162 will be described in comparison with a general process of forming a potting configuration.

In the general process of forming a potting configuration, a potting configuration needs to be formed on one surface after another in order to pot the front side and the rear side because of the nature of the potting configuration. That is, after a process of potting and hardening one surface is carried out, and a process of potting and hardening the opposite surface is needed. However, according to the exemplary embodiment of the present specification, the first and second potting layers 161 and 162 may be formed by incorporating the processes of potting the front side and the rear side by means of the structures of the connector cover 140 and the back cover 150.

Thereafter, the screw 111 is coupled into the at least one screw groove 141 formed at the edge of the lateral side of the connector cover 140, such that the connector cover 140 may be fixed by being tightly attached to the extruded housing 110.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. An electronic control apparatus for a vehicle, comprising:
    an electronic control board which electrically controls respective parts in the vehicle;
    a connector which is electrically connected with the electronic control board;
    an extruded housing which is opened at both sides, and has one side into which the connector connected with the electronic control board is inserted and accommodated in a slot manner;
    a connector cover which is coupled to the connector and covers the one open side of the extruded housing into which the connector is inserted; and
    a back cover which covers the other open side of the extruded housing,
    wherein a first potting layer is formed at an upper side of the connector cover, and
    wherein a second potting layer is formed in the extruded housing to which the back cover is coupled such that a connecting portion between the extruded housing and the back cover is sealed.

2. The electronic control apparatus of claim 1, wherein the first potting layer and the second potting layer are formed by applying a potting liquid with predetermined viscosity or higher onto the connector cover and the back cover, respectively, in order to prevent foreign substances from flowing into the extruded housing.

3. The electronic control apparatus of claim 1, wherein the connector cover further includes at least one screw groove which is formed at an edge of a lateral side thereof so as to fix the connector cover to the extruded housing by means of a screw.

4. The electronic control apparatus of claim 1, wherein the connector cover further includes a cover extended portion which is extended by a predetermined length along a lateral side adjacent to the extruded housing and the connector.

5. The electronic control apparatus of claim 1, wherein the connector cover is provided with a stepped portion, which is formed at an upper side of the connector cover and has a height greater than a height of the first potting layer, in order to reduce the amount of potting liquid applied to form the first potting layer, and the first potting layer is formed at a remaining portion except for the stepped portion.

6. The electronic control apparatus of claim 1, wherein the back cover further includes at least one protruding portion which separates the back cover from the extruded housing when the potting liquid is applied to form the second potting layer in the back cover adjacent to the other side of the extruded housing.

7. The electronic control apparatus of claim 1, wherein the back cover further includes a convex portion which allows the potting liquid to flow toward a waterproofing portion at the edge thereof when the potting liquid is applied to form the second potting layer in the back cover adjacent to the other side of the extruded housing.

* * * * *